United States Patent [19]

Lattin

[11] 4,083,045
[45] Apr. 4, 1978

[54] MOS ANALOG TO DIGITAL CONVERTER

[75] Inventor: William Walter Lattin, Phoenix, Ariz.

[73] Assignee: Motorola, Inc., Schaumburg, Ill.

[21] Appl. No.: 593,074

[22] Filed: Jul. 3, 1975

[51] Int. Cl.² .............................................. H03K 13/00
[52] U.S. Cl. .............................. 340/347 AD; 307/246
[58] Field of Search ............................... 340/347 AD; 307/279–281, 235 N, 235 P, 235 B, 251, 205, DIG. 4, 304, 246; 357/23, 14

[56] References Cited

U.S. PATENT DOCUMENTS

| 3,719,835 | 3/1973 | Eberhard | 307/279 |
|---|---|---|---|
| 3,743,862 | 7/1973 | Bell | 307/205 |
| 3,753,006 | 8/1973 | Crawford | 307/205 |
| 3,889,135 | 6/1975 | Nomiya et al. | 307/251 |
| 3,911,466 | 10/1975 | Lattin | 357/23 |
| 3,916,327 | 10/1975 | Lampen et al. | 307/235 N |
| 3,942,047 | 3/1976 | Buchanan | 307/279 |
| 4,021,788 | 5/1977 | Marr | 307/246 |

Primary Examiner—Malcolm A. Morrison
Assistant Examiner—Errol A. Krass
Attorney, Agent, or Firm—Anthony J. Sarli, Jr.

[57] ABSTRACT

An MOS analog to digital converter circuit is provided in which an MOS enhanced capacitor is interposed between a buffer circuit responsive to an analog input and a digital output. The capacitance value present between the first terminal and the second terminal of the MOS enchanced capacitor is determined by the particular value of analog input voltage applied via the input buffer circuit. An oscillator pulse coupled to a second terminal of the enhanced capacitor produces a resultant pulse on the first terminal of the enhanced capacitor which in turn is coupled to an input of digital comparator circuits which are part of the digital output means. A series of reference voltages coupled to the other inputs of the digital comparator circuits allow the generation of a series of digital output signals whose value is indicative of the value of analog input signal present, thus accomplishing the analog to digital conversion function.

6 Claims, 3 Drawing Figures

MOS ANALOG TO DIGITAL CONVERTER

BACKGROUND

This invention relates to analog to digital converter circuits and more particularly to MOS analog to digital converter circuits including enhanced capacitors.

The problem of converting analog signal values to an equivalent digital representation appropriate for various digital computing or digital readout requirements is basic to the digital computer field. Numerous prior art solutions to this problem have been proposed using a wide variety of circuit techniques.

Although monolithic integrated circuits using MOSFET devices have been widely used to implement a wide variety of complex digital functions, they have not been extensively utilized to fulfill the requirements of analog to digital converter circuits because of present wide tolerance variations in MOSFET device characteristics associated with present manufacturing methods. One approach to analog to digital conversion has been to provide a common analog input to a plurality of digital comparator circuits in which each of the comparator circuits has a separate input connection to a reference voltage. The different individual reference voltages thus partition the analog input voltage into different ranges depending upon whether the analog input signal is above or below a particular reference voltage value. These ranges are then correspondingly represented by the digital outputs of the comparators. A direct connection of the analog input signal to the inputs of digital comparator circuits suffers the fundamental disadvantage that the connection cannot be interrupted for operation on a sample mode basis. Also, a direct connection precludes the use of temperature or voltage compensation via series and shunt elements.

SUMMARY

Accordingly, it is an object of this invention to provide an analog to digital converter circuit in which an input buffer isolates the analog input signal from the comparator inputs.

It is a further object of this invention to provide an analog to digital converter circuit in which an MOS enhanced capacitor coupled to an input buffer responsive to the analog input provides a comparator input signal which is a scaled replica of the analog input voltage dependent upon a capacitance ratio.

Briefly described, the present invention is an analog to digital converter circuit in which an MOS enhanced capacitor is coupled to an input means responsive to an analog input such that the analog input value determines the capacitance value exhibited by the MOS enhanced capacitor and in which a digital output means is coupled to the MOS enhanced capacitor to a digital output signal whose value is proportional to the capacitance value established by the analog input voltage. In another embodiment of the present invention, an analog to digital converter circuit is provided in which a first pulse source is coupled to one terminal of a MOS enhanced capacitor while another terminal of the MOS enhanced capacitor is coupled to an analog input terminal and to one input of a digital comparator circuit. A second pulse source has an output terminal which is coupled to a second input of the digital comparator circuit such that the output of the digital comparator circuit is a digital representation of the relative amplitudes of the second pulse source and of a first pulse source as determined by the value of the analog input signal.

DETAILED DESCRIPTION

Figure 1:
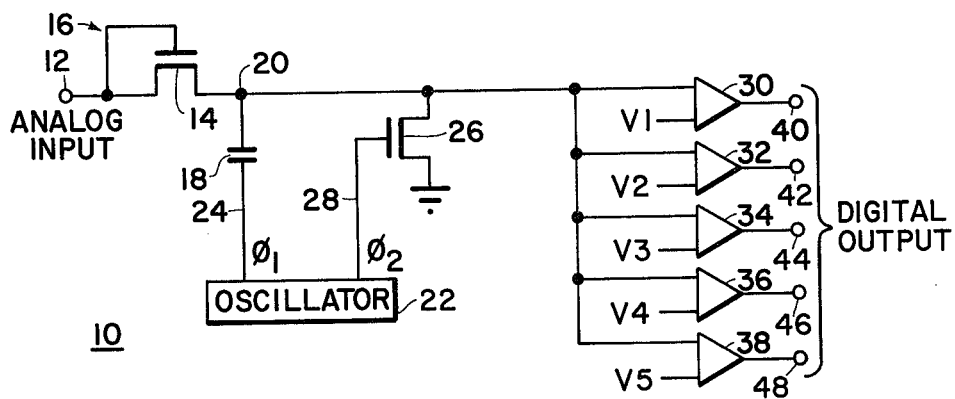
FIG. 1 shows a MOS analog to digital converter circuit according to the present invention.

FIG. 1 shows an MOS analog to digital converter circuit 10 according to the present invention. An analog input signal is applied to an input terminal 12 which is coupled to the drain electrode of MOSFET 14 via conductor 16 which also is connected to the gate electrode of MOSFET 14 to form a voltage follower circuit. The source electrode of MOSFET 14 is connected to a first terminal of enhanced capacitor 18 via conductor 20. Capacitor 18 may be a normal MOS enhanced capacitor or may be a digitally controlled MOS enhanced capacitor. The second terminal of capacitor 18 is connected to the $\phi 1$ output terminal of oscillator 22 via conductor 24. Conductor 20 also is connected to the drain electrode of MOSFET 26 whose gate electrode connects to the $\phi 2$ output terminal of oscillator 22 via conductor 28. The source electrode of MOSFET 26 is connected to ground. Conductor 20 also is connected in common to one input of digital comparator circuits 30, 32, 34, 36 and 38, each of which has another input connected to reference voltages V1, V2, V3, V4, and V5, respectively, and each of which has digital output terminals 40, 42, 44, 46 and 48, respectively.

Figure 3:
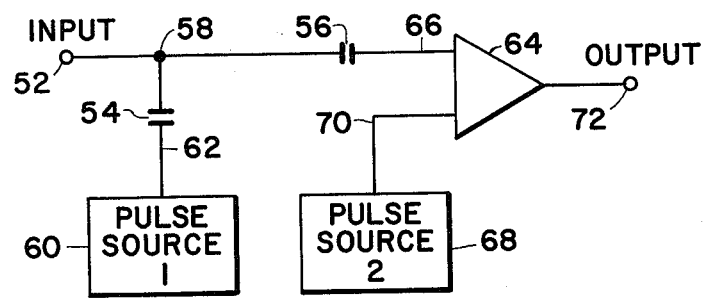
FIG. 3 shows another embodiment of the analog to digital converter circuit of the present invention.

FIG. 3 shows another embodiment of an MOS analog to digital converter circuit 50 according to the present invention. Analog input 52 is connected to a first terminal of enhanced capacitor 54 and to a first terminal of a second capacitor 56, which may be an ordinary MOS capacitor, via conductor 58. The second terminal of MOS enhanced capacitor 54 is connected to pulse source 1, indicated by reference numeral 60, via conductor 62. The second terminal of capacitor 56 is connected to one input of digital comparator 64 via conductor 66. The second input of digital comparator 64 is connected to pulse source 2, reference numeral 68, via conductor 70. The output of comparator 64 is connected to output terminal 72.

Those skilled in the art will recognize that MOSFETs (metal oxide semiconductor field effect transistors), as implemented in typical integrated circuits, are bilateral devices, having a gate and a source and a drain. However, the source and drain are functionally interchangeable, and both in the description and in the claims herein, the terms are utilized merely to indicate interconnections, rather than function of a particular MOSFET terminal. For example, the terminal of a MOSFET which functions as a drain for one part of the circuit operation may function as a source for another part of the circuit operation. For a more complete description of the operation and physics of MOSFETs, see "Physics and Technology of Semiconductor Devices", by A. S. Grove, John Wiley & Sons, Inc., 1967. Those skilled in the art will also recognize that the acronym MOSFET is commonly used synonymously with the term IGFET (insulated gate field effect transistors), even though the gate may be polycrystalline silicon or some other conductive material rather than metal.

Figure 2:
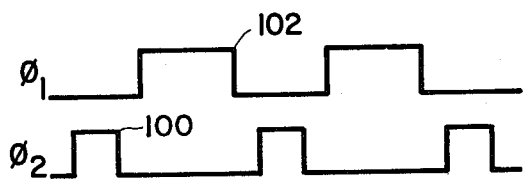
FIG. 2 shows a timing diagram illustrative of the operation of the circuit of FIG. 1.

Operation of a particular embodiment of the present invention is understood by considering the circuit of FIG. 1 in conjunction with the timing diagram shown in FIG. 2. Incidentally, the IGFETs (insulated gate field effect transistor) in FIG. 1 may be of the N channel or the P channel variety. However, in the description of the operation of the MOS analog to digital converter circuit 10, which is set forth with reference to the timing diagram of FIG. 2, it is assumed that all of the IGFETs are of the N channel variety. Initially, the positive pulse produced at point 100 of the $\phi 2$ output waveform of oscillator circuit 22 is applied to the gate of IGFET 26 via conductor 28. This results in a low impedance conductive path which momentarily connects conductor 20 to ground potential thus discharging the stray capacitance associated with conductor 20. The analog input signal applied to terminal 12 is reproduced at conductor 20 translated down by the threshold voltage of IGFET 14 which acts as a voltage follower because of the short circuit connection between its drain and source terminals formed by conductor 16. Thus, IGFET 14 acts to buffer analog input terminal 12 such that the voltage at analog input 12 is applied to conductor 20 without loading effects. The translated voltage applied at conductor 20 connects to the first terminal of enhanced capacitor 18 whose second terminal 24 connects to the $\phi 1$ output of oscillator 22. The operation of enhanced capacitor 18 which may be digitally controllable, is explained in U.S. Pat. No. 3,911,466, by Lattin, and assigned to the present assignee, and as therein described, has the particular property of having a capacitance value which is a function of the DC voltage applied to it.

Thus, in this particular case, the capacitance value exhibited by enhanced capacitor 18 connected in the circuit between conductors 24 and conductors 20 is a function of the particular value of analog input signal applied at terminal 12. The combination of this analog voltage level and the particular capacitance value exhibited by enhanced capacitor 18 at this voltage level determines total energy stored on enhanced capacitor 18. Thus, when the $\phi 1$ output of oscillator 22 goes positive at point 102 of the $\phi 1$ waveform in FIG. 2, a voltage is established at conductor 20 which is a function of the ratio of the stray capacitance between conductor 20 and ground potential (not shown) and the particular value of capacitance exhibited by enhanced capacitor 18 in response to the particular level of analog input voltage applied at terminal 12. This voltage is coupled to one input of digital comparators 30, 32, 34, 36 and 38 and results in the particular digital output on corresponding digital output terminals 40, 42, 44, 46 and 48.

The operation of each digital comparator circuit is conventional. For example, considering comparator circuit 30, when the voltage applied to one input terminal via conductor 30 is greater than the reference voltage V1 applied to the second input terminal, the digital output appearing at output terminal 40 will be a logic "1". If the voltage applied via conductor 30 is not greater than the reference voltage V1, the output of comparator circuit 30 appearing at output terminal 40 will be a logic "0". The operation of each of the remaining comparator circuits 32, 34, 36 and 38 is the same and it is thus seen that the digital output of these circuits is a measure of the voltage applied via conductor 20 which is in turn determined by the particular capacitance ratio established in response to the value of the analog input voltage. Thus, the circuit of the present invention has been shown to operate in a mode which provides analog to digital conversion. Although the circuit of the present invention embodied in FIG. 1 could be implemented in many ways, it is important to note that the particular embodiment involves only MOSFET devices or circuit functional blocks which could be implemented with MOSFET devices and in particular, an integrated circuit implementation would offer many advantages over prior art analog to digital converters.

Operation of another particular embodiment of the present invention is understood by considering the circuit of FIG. 3. Basically, this circuit provides for pulse amplitude comparison wherein the amplitude of one pulse may be scaled using an enhanced capacitor network. The operation of the circuit provides then an analog input voltage applied to input terminal 52 establishing a voltage level at conductor 58 which in turn determines the capacitance value exhibited by enhanced capacitor 54. The second terminal 62 of enhanced capacitor 54 is connected to a pulse source which is initially at a low potential. The basic operation of the circuit assumes simultaneous output pulses from pulse source 1, 60 and pulse source 2, 68. The operation of digital comparator 64 is conventional in that if the pulse amplitude applied to the first input terminal via conductor 66 is less than the pulse amplitude applied to the second input via conductor 70, the digital output at terminal 72 will be a logic "0". Conversely, if the pulse amplitude applied via conductor 66 is greater than the pulse amplitude applied via conductor 70, the digital output at terminal 72 will be a logic "1". Thus, with the simultaneous appearance of pulses from pulse source 1 on conductor 62 and from pulse source 2 on conductor 70, a resultant set of pulses is applied to the two inputs of digital comparator circuit 64. The pulse amplitude applied via conductor 66 is a function of the ratio of capacitance values of capacitors 54 and 56, and as previously described, since capacitor 54 is a enhanced capacitor, the pulse amplitude applied via conductor 66 is in turn a function of the analog input voltage applied at input terminal 52. Thus, the circuit 50 functions as a particular type of MOS analog to digital converter wherein a digital output is produced which indicates whether the amplitude of a reference pulse source 68 has been exceeded by a scaled or ratioed replica of a first pulse source 60 wherein the ratioing or scaling factor is determined by the value of an analog input. Because the MOS analog to digital converter circuit 50 comprises circuit elements, all of which can be implemented using MOSFET circuits and in particular, these MOSFET circuits can be arranged in an integrated circuit embodiment, the digital circuit approach provided by the present invention is the key to a converter circuit of greatly reduced complexity and cost.

What is claimed is:
1. An analog to digital converter circuit comprising:
 (a) enhanced capacitor means having a first terminal and a second terminal;
 (b) buffer circuit means coupled to said first terminal, said buffer circuit means responsive to an analog input signal;
 (c) digital comparator means having a first input terminal coupled to said first terminal and having a second input terminal coupled to a reference voltage, said digital comparator means producing a first logical state when said first input terminal is at a greater potential than said second input terminal and said digital comparator means producing a second logical output state when said first input terminal is at a lesser potential than said second input terminal;

(d) circuit means coupled to said second capacitor terminal for producing a voltage pulse at said second capacitor terminal, thereby inducing a derived voltage pulse at said first capacitance terminal said derived voltage pulse establishing input conditions at said first input terminal to produce a digital output signal proportional to said analog input signal, and (e) MOSFET switching means coupled to said first capacitor terminal and coupled to said circuit means, said MOSFET switching means responsive to said circuit means for establishing initial voltage conditions at said first capacitor terminal.

2. An MOS analog to digital converter circuit comprising:

(a) enhanced capacitor means having a first capacitor terminal and a second capacitor terminal;

(b) input means responsive to an analog input value and coupled to said first capacitor terminal, said analog input value determining a capacitance value between said first capacitance terminal and said second capacitance terminal;

(c) digital output means coupled to said first capacitance terminal for producing a digital output signal whose value is proportionate to the capacitance value established between said first capacitor terminal and said second capacitor terminal by said analog input value, and (d) means coupled to said digital output means for establishing initial voltage conditions at said first capacitor terminal.

3. An analog to digital converter circuit comprising:

(a) digital comparator means having a first input terminal, a second input terminal and a digital output terminal;

(b) second pulse source means having an output terminal coupled to said second input terminal;

(c) capacitance means having a first terminal and a second terminal, said second terminal coupled to said first input terminal;

(d) enhanced capacitance means having a first terminal and a second terminal, the first terminal of the enhanced capacitance means coupled to the first terminal of the capacitance means and coupled to a terminal to provide an analog input for said converter circuit; and (e) a first pulse source having an output terminal connected to said second terminal of said enhanced capacitance means.

4. The analog to digital converter circuit recited in claim 3 wherein said enhanced capacitor means is a digitally controllable enhanced capacitor.

5. The analog to digital converter circuit recited in claim 4 wherein said first pulse source, said second pulse source and said digital output means comprise MOSFET devices.

6. The analog to digital converter circuit recited in claim 5 wherein said MOSFET devices are incorporated in a monolithic integrated circuit.

* * * * *